(12) United States Patent
Song et al.

(10) Patent No.: US 11,444,219 B2
(45) Date of Patent: Sep. 13, 2022

(54) SENSOR PACKAGE ARRAY, METHOD OF MANUFACTURING THE SAME, AND SENSOR PACKAGE STRUCTURE

(71) Applicant: LITE-ON SINGAPORE PTE. LTD., Singapore (SG)

(72) Inventors: Guang-Li Song, Singapore (SG); Wei-Chee Lee, Singapore (SG); Qian Pang, Jiamusi (CN)

(73) Assignee: LITE-ON SINGAPORE PTE. LTD., Singapore (SG)

( * ) Notice: Subject to any disclaimer, the term of this patent is extended or adjusted under 35 U.S.C. 154(b) by 79 days.

(21) Appl. No.: 17/037,833

(22) Filed: Sep. 30, 2020

(65) Prior Publication Data

US 2022/0102575 A1    Mar. 31, 2022

(51) Int. Cl.
*H01L 27/15*   (2006.01)
*H01L 29/16*   (2006.01)
*H01L 31/12*   (2006.01)
*H01L 33/00*   (2010.01)
*H01L 31/16*   (2006.01)
*H01L 27/14*   (2006.01)
H01L 31/0203  (2014.01)

(52) U.S. Cl.
CPC .............. *H01L 31/16* (2013.01); *H01L 27/14* (2013.01); *H01L 27/15* (2013.01); *H01L 31/0203* (2013.01)

(58) Field of Classification Search
CPC ..... H01L 31/16; H01L 31/0203; H01L 27/14; H01L 27/15
USPC ............................................................ 257/82
See application file for complete search history.

(56) References Cited

U.S. PATENT DOCUMENTS

| | | | |
|---|---|---|---|
| 2011/0291139 A1* | 12/2011 | Chiu ...................... | H01L 31/048 257/E33.056 |
| 2014/0021491 A1* | 1/2014 | Meng ...................... | H01L 33/54 257/82 |

* cited by examiner

*Primary Examiner* — Calvin Y Choi
(74) *Attorney, Agent, or Firm* — Li & Cai Intellectual Property (USA) Office

(57) ABSTRACT

A sensor package array, a method of manufacturing the same, and a sensor package structure are provided. The method of manufacturing a sensor package array including: disposing a plurality of sensors on a substrate sequentially in an array; electrically connecting the plurality of sensors to the substrate; disposing a plastic shield on the substrate, so as to form a plurality of channels and a plurality of accommodating grooves among the plastic shield, the substrate, and the plurality of sensors; and filling a sealing material in the plurality of accommodating grooves, through the plurality of channels.

18 Claims, 9 Drawing Sheets

SENSOR PACKAGE ARRAY, METHOD OF MANUFACTURING THE SAME, AND SENSOR PACKAGE STRUCTURE

FIELD OF THE DISCLOSURE

The present disclosure relates to a method of manufacturing sensor package array, and more particularly to a manufacturing method that effectively reduces a volume of a package structure of a sensor.

BACKGROUND OF THE DISCLOSURE

In recent years, the size of optical sensor package structures are reduced through utilizing particular sealing material or through not using light shielding elements in methods of packaging optical sensors. However, the afore-mentioned methods lead to a high signal crosstalk, which requires additional algorithm methods in chips, such that sensing deviations caused by the crosstalk interference are remunerated.

However, utilizing algorithm methods to rectify the high signal crosstalk can lead to sensing deviation issues. In addition to the effect that the rectification may not be accurate, adding additional algorithm methods in the chips increases the manufacturing cost of the sensors.

Therefore, how the package structure design can be improved by enhancing the sensitivity of the sensors without increasing the cost, while at the same time reducing the volume of the package structures, has become an important issue for the industry.

SUMMARY OF THE DISCLOSURE

In response to the above-referenced technical inadequacies, the present disclosure provides a method of manufacturing sensor packaging, in which the volume of the sensor package structures, proximity sensors to be more particular, can be effectively reduced.

In one aspect, the present disclosure provides a method of manufacturing a sensor package array, including: disposing a plurality of sensors on a substrate sequentially in an array; electrically connecting the plurality of sensors to the substrate; disposing a plastic shield on the substrate, so as to form a plurality of channels and a plurality of accommodating grooves among the plastic shield, the substrate, the plurality of sensors; and filling a sealing material in the plurality of accommodating grooves through the plurality of channels.

In certain embodiments, each of the plurality of sensors includes one of a plurality of detectors and one of a plurality of emitters, the plastic shield includes a plurality of barrier walls, and when the plastic shield is disposed on the substrate, the plurality of barrier walls are respectively positioned between each of the plurality of emitters and each of the plurality of detectors, so as to block and prevent the light emitted by each of the plurality of emitters from being transmitted to each of the corresponding plurality of detectors.

One of the advantages of the present disclosure is that, compared with the conventional manufacturing method of sensor packages, the method of manufacturing a sensor package array provided by the present disclosure is able to effectively reduce the space between the plastic shield and the plurality of emitters and the plurality of detectors, and reduce the volume of the package structures, through disposing the plastic shield on the substrate and then filling the sealing material in the space between the plastic shield and the substrate.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Embodiment

Figure 1:
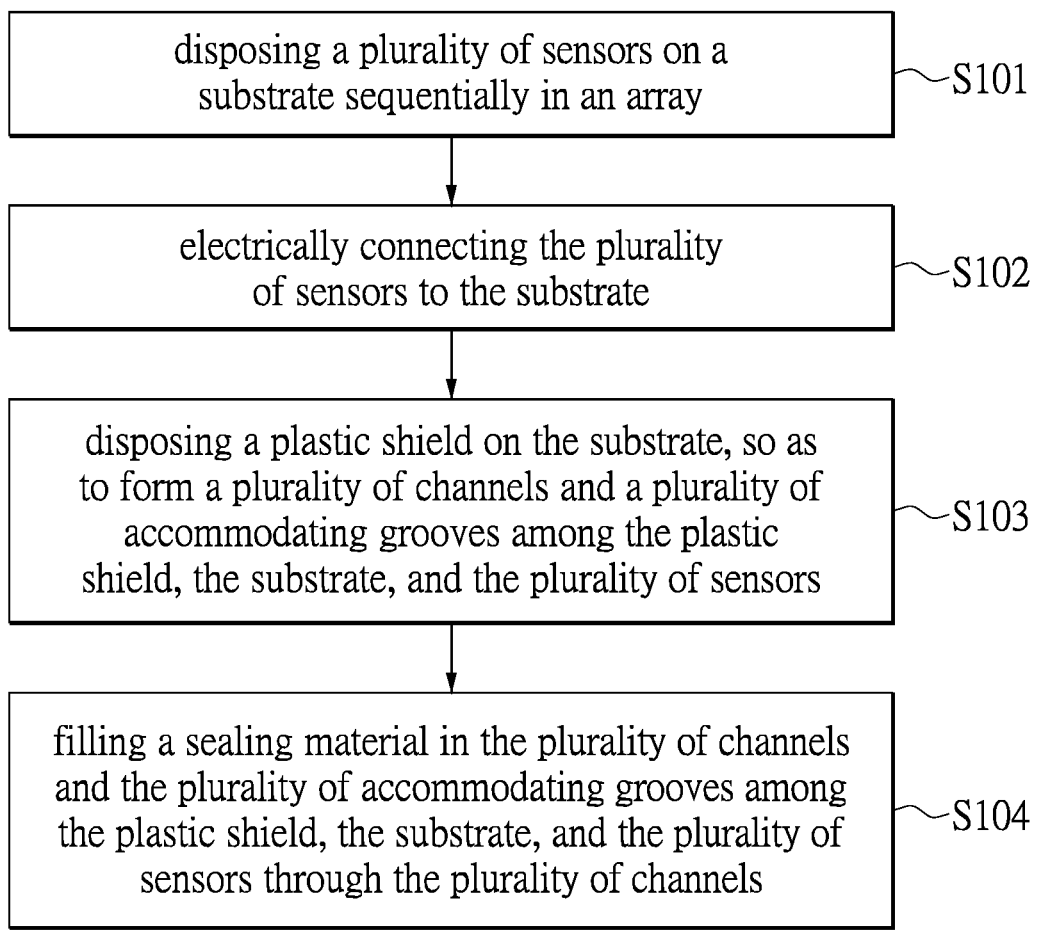
FIG. 1 is a flowchart of the method of manufacturing a sensor package array of the present disclosure.

Reference is made to FIG. 1, and in conjunction with FIG. 2A to FIG. 6. A manufacturing method of sensor package structures 2 is provided in one embodiment of the present disclosure, including the following steps.

Figure 2A:
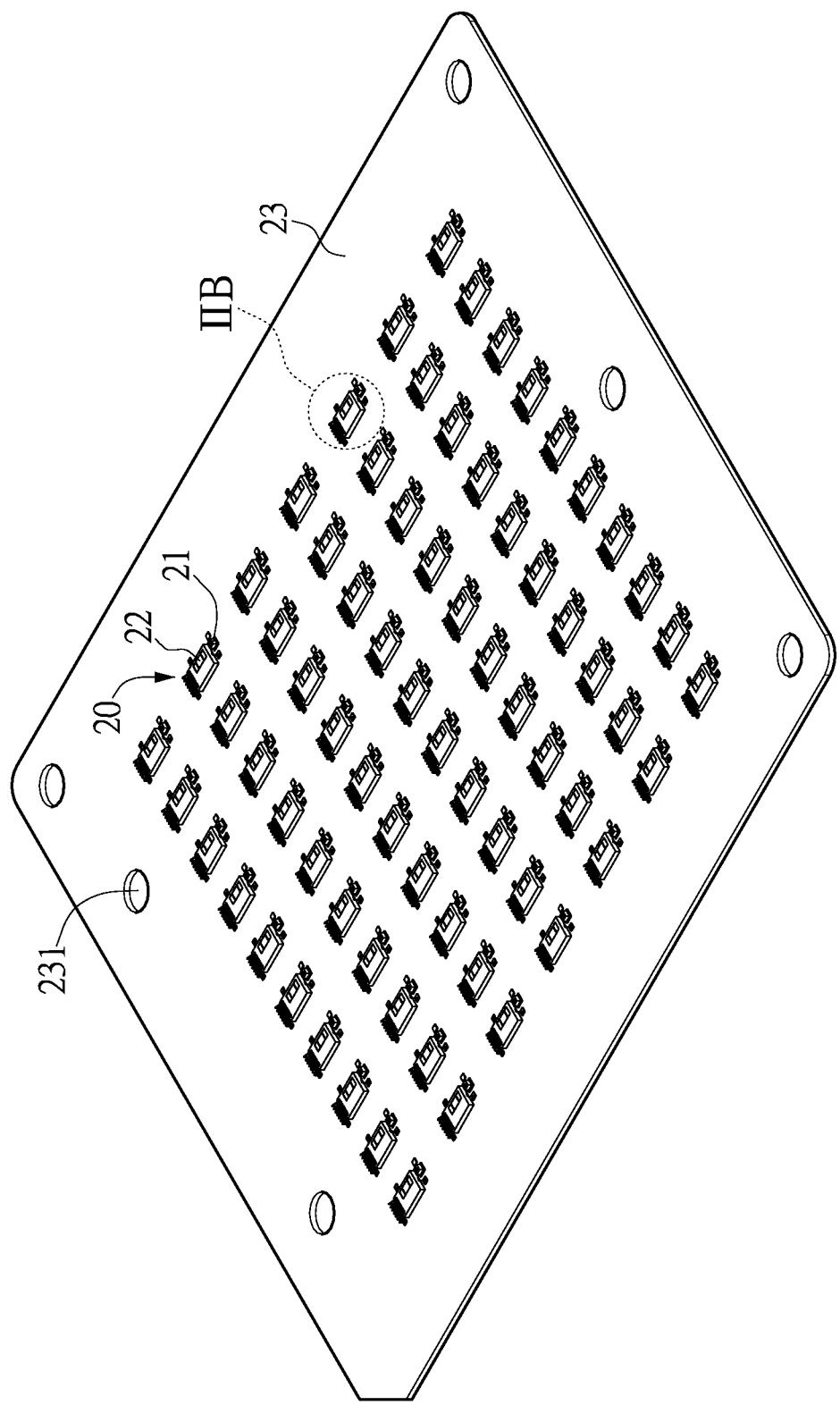
FIGS. 2A and 2B are respectively a schematic view of a substrate of a sensor package structure and an enlarged partial perspective view of the substrate of the present disclosure.
Figure 2B:
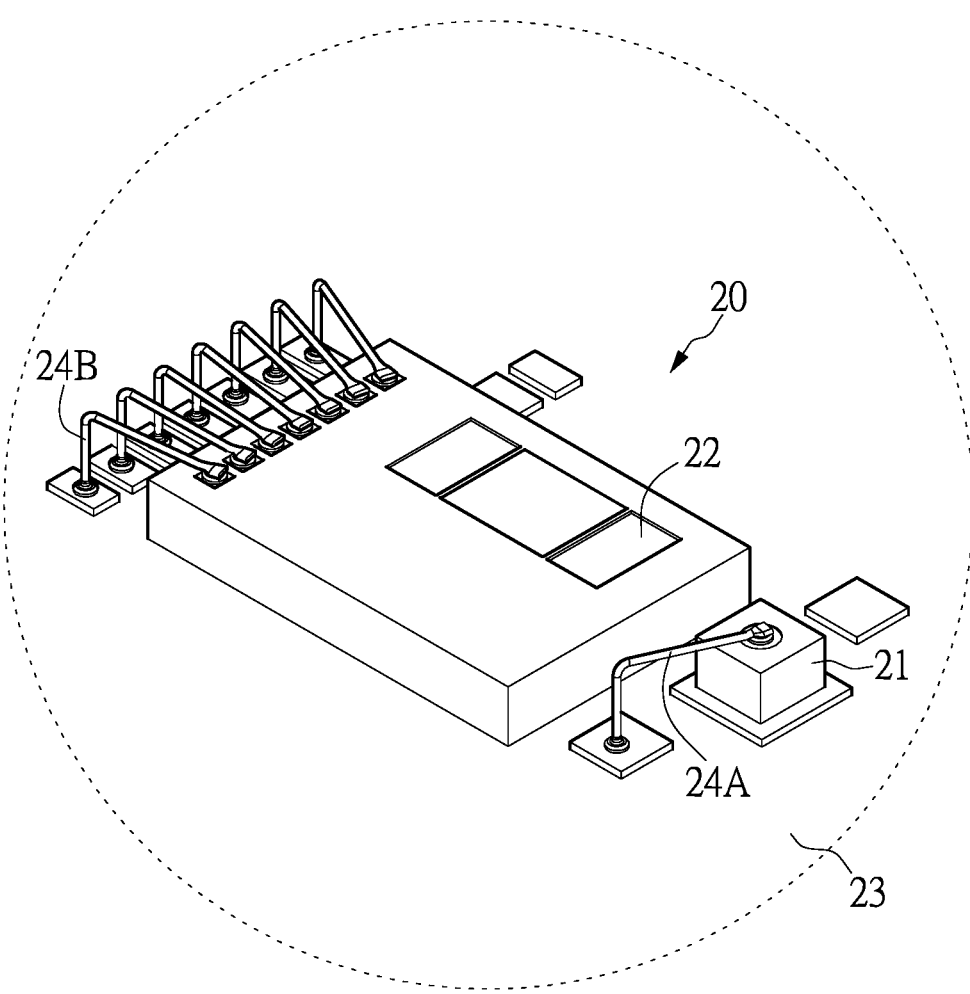

In Step S101, a plurality of sensors 20 are disposed on a substrate 23 sequentially in an array, and each of the plurality of sensors 20 includes one of a plurality of emitters 21 and one of a plurality of emitters 22, as shown in FIG. 2A. The substrate 23 includes a plurality of first positioning portions 231, as shown in FIGS. 2A and 2B. The plurality of emitters 21 is preferably light signal emitters, e.g., light emitting diodes (LED), the plurality of detectors 22 can be light signal detectors, and can be disposed on integrated circuit chips, and each one of the integrated circuit chips can include one or more of the plurality of detectors 22. The substrate 23 is a circuit board, e.g., a printed circuit board (PCB) or a ceramic circuit board. However, in another embodiment, the plurality of emitters 21 can be different signal emitters, and the plurality of detectors 22 is not limited to light signal detectors.

Figure 3A:
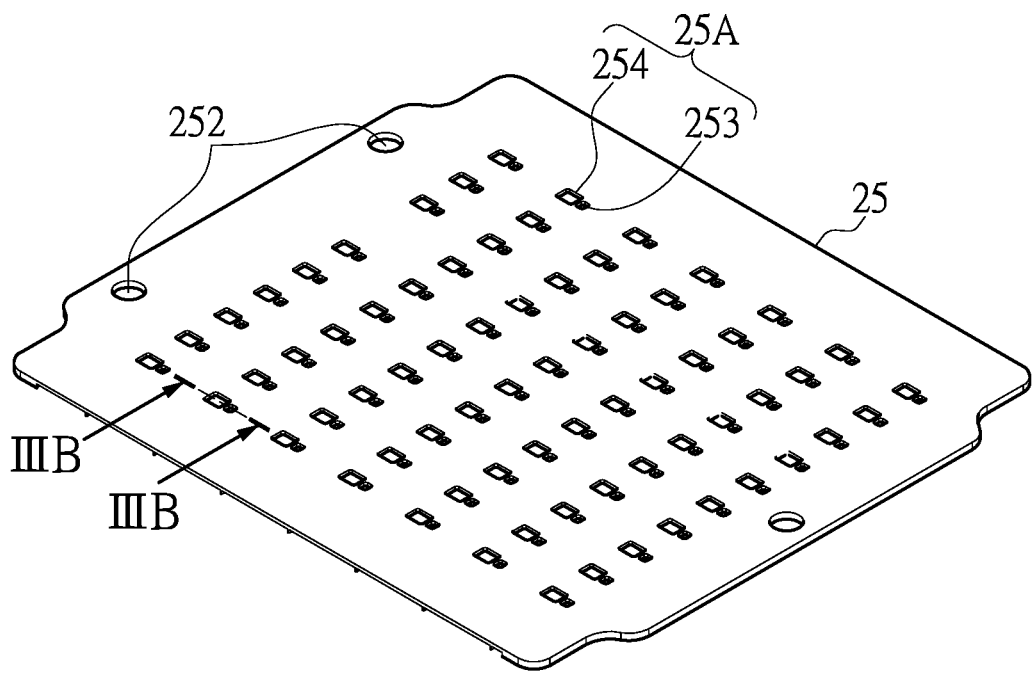
FIGS. 3A and 3B are respectively a schematic view and a sectional view of a plastic shield of the sensor package structure of the present disclosure.
Figure 3B:
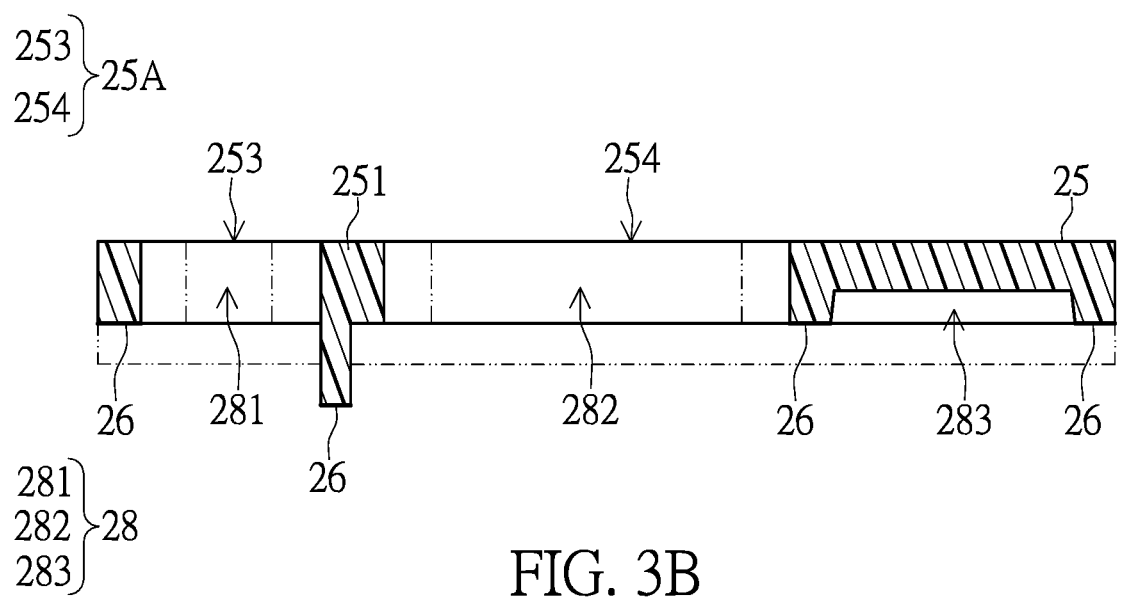

Moreover, after the step of disposing the plurality of sensors 20 on the substrate 23 sequentially in an array, in Step S102, the plurality of emitters 21 and the plurality of detectors 22 are electrically connected to the substrate 23. In the manufacturing method of the sensor package structures 2 of the present disclosure, the plurality of sensors 20 are respectively disposed on the substrate 23 sequentially in an array, which indicates that the plurality of sensors 20 are disposed on the substrate 23 one at a time in an array, so as to complete the step of disposing the plurality of sensors 20 on the substrate 23. Furthermore, as shown in FIG. 2B, each of the plurality of emitters 21 and each of the plurality of detectors 22 are electrically connected to the substrate 23, through wire bonding with a plurality of first wires 24A and a plurality of second wires 24B (i.e., a plurality of wires), respectively. Through automatic wire bonding, the plurality of first wires 24A and the plurality of second wires 24B are disposed on the substrate 23, such that each of the plurality of emitters 21 and each of the plurality of detectors 22 can be electrically connected to the substrate 23 rapidly. Furthermore, in a preferable embodiment, an adhesive 26 can be further applied on a plastic shield 25. As shown in FIG. 3B, the adhesive 26 can be applied on the plastic shield 25, such that the plastic shield 25 can be fixedly covered on the substrate 23. The plastic shield 25 is preferably made of an insulating material, e.g., a plastic material, and the adhesive 26 is used to adhere the plastic shield 25 on the substrate 23, and the material of the adhesive 26 is preferably black epoxy resins, but in another embodiment, the plastic shield 25 and the adhesive 26 can be replaced with different materials, and the present disclosure is not limited thereto. In addition, in yet another embodiment, applying the adhesive 26 is not required, and the plastic shield 25 can be directly disposed on the substrate 23, in which the present disclosure is not limited thereto.

In the manufacturing method of the present disclosure, when the sensor package structure 2 is in operation, in order to prevent the signals of the plurality of emitters 21 are transmitted directly to the plurality of detectors 22, which causes the signal crosstalk interference, a barrier structure is required between each of the plurality of emitters 21 and each of the plurality of detectors 22 when the substrate 23 is covered by the plastic shield 25. Therefore, an integrally formed plastic shield 25, which has a plurality of barrier walls 251, is designed, as shown in FIG. 3B. In a preferable embodiment in the present disclosure, when the plastic shield 25 is disposed on the substrate 23, the plurality of barrier walls 251 of the plastic shield 25 are respectively positioned between each of the plurality of emitters 21 and each of the plurality of detectors 22, so as to reduce the occurrence of the signal crosstalk interference. Furthermore, the plastic shield 25 can block or barricade a receiving or emitting predetermine wavelength of light, e.g., an infrared light, and the material and the thickness of the plastic shield 25 can be determined according to the types of the plurality of emitters 21.

The plurality of barrier walls 251 are preferably in bar shapes and an end of each of the plurality of barrier walls 251 protrudes from the plastic shield 25. A first surface 251A of each of the plurality of barrier walls 251 abuts against the substrate 23, and a second surface 251B of each of the plurality of barrier walls 251 abuts against the plurality of detectors 22. Therefore, the plurality of barrier walls 251 are able to block any direct or scattered signals and light signals of the plurality of emitters 21, and prevent the signals and the light signals from being transmitted to the plurality of detectors 22. The above mentioned description is merely an example to describe the shapes of the plurality of barrier walls 251 and the connective relation between the plurality of barrier walls 251 and other elements, and the present disclosure is not limited thereto. In another embodiment, the plurality of barrier walls 251 can be in any shape, e.g., a columnar shape, and can be plug-in structures that are inserted in or penetrated through the substrate 23, which can also serve the purpose of positioning portions. The barrier walls 251 of the present disclosure are able to block and prevent the signals of the plurality of emitters 21 from being transmitted to the plurality of detectors 22.

Figure 3C:
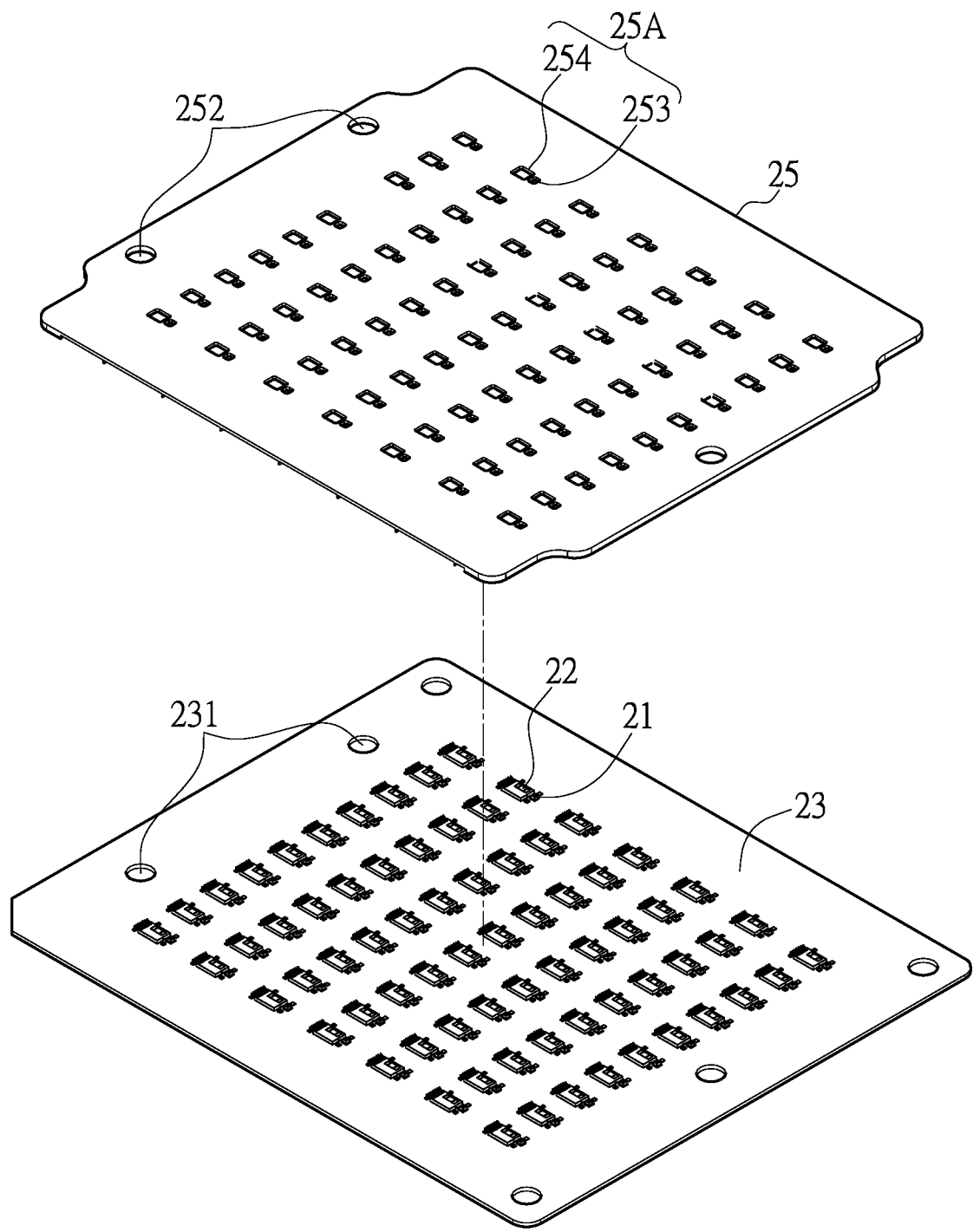
FIG. 3C is a schematic view showing the plastic shield and the substrate of the present disclosure that are assembled to each other.

In Step S103, the plastic shield 25 is disposed on the substrate 23, so as to form a plurality of channels 27 and a plurality of accommodating grooves 28 between the plastic shield 25 and the substrate 23. In one preferable embodiment of the present disclosure, when the plastic shield 25 is disposed on the substrate 23, as shown in FIGS. 3B and 3C, the substrate 23 preferably has the plurality of first positioning portions 231, and the plastic shield 25 includes, in addition to the plurality of barrier walls 251, a plurality of second positioning portions 252, a plurality of openings 25A (i.e., a plurality of first openings 253 and a plurality of second openings 254), a plurality of first protrusions 255, and a plurality of second protrusions 256. Moreover, the plurality of second positioning portions 252 is disposed corresponding to the plurality of first positioning portions 231. When the plastic shield 25 is disposed on the substrate 23, each of the plurality of second positioning portions 252 can be used to position each of the plurality of first positioning portions 231, so that each of the plurality of first openings 253 and the plurality of second openings 254 can be disposed respectively above each of the plurality of emitters 21 and the plurality of detectors 22. The plurality of first openings 253 and the plurality of second openings 254 are respectively formed on the plastic shield 25, and correspond in position to the plurality of emitters 21 and the plurality of detectors 22, respectively. Furthermore, each of the plurality of first openings 253 is disposed between each of the plurality of first protrusions 255 and the plurality of barrier walls 251, and each of the plurality of second openings 254 is disposed between each of the plurality of barrier walls 251 and the plurality of second protrusions 256.

In a preferable embodiment of the present disclosure, as shown in FIG. 3C, the plurality of first positioning portions 231 and the plurality of second positioning portions 252 are preferably through holes, but in another embodiment, the plurality of first positioning portions 231 and the plurality of second positioning portions 252 can also be engaging structures, and the present disclosure is not limited thereto. The plurality of first positioning portions 231 and the plurality of second positioning portions 252 can be through holes, and when the plastic shield 25 is covered on the substrate 23, the plurality of second positioning portions 252 of the plastic shield 25 respectively correspond to the plurality of first positioning portions 231 of the substrate 23 for positioning. In yet another embodiment, the plurality of first positioning portions 231 can be protrusions, and the plastic shield 25 can be accurately aligned with the substrate 23 when being covered thereon, through respectively corresponding the plurality of second positioning portions 252, which are the through holes, to the plurality of first positioning portions 231, which are the protrusions.

Figure 4A:
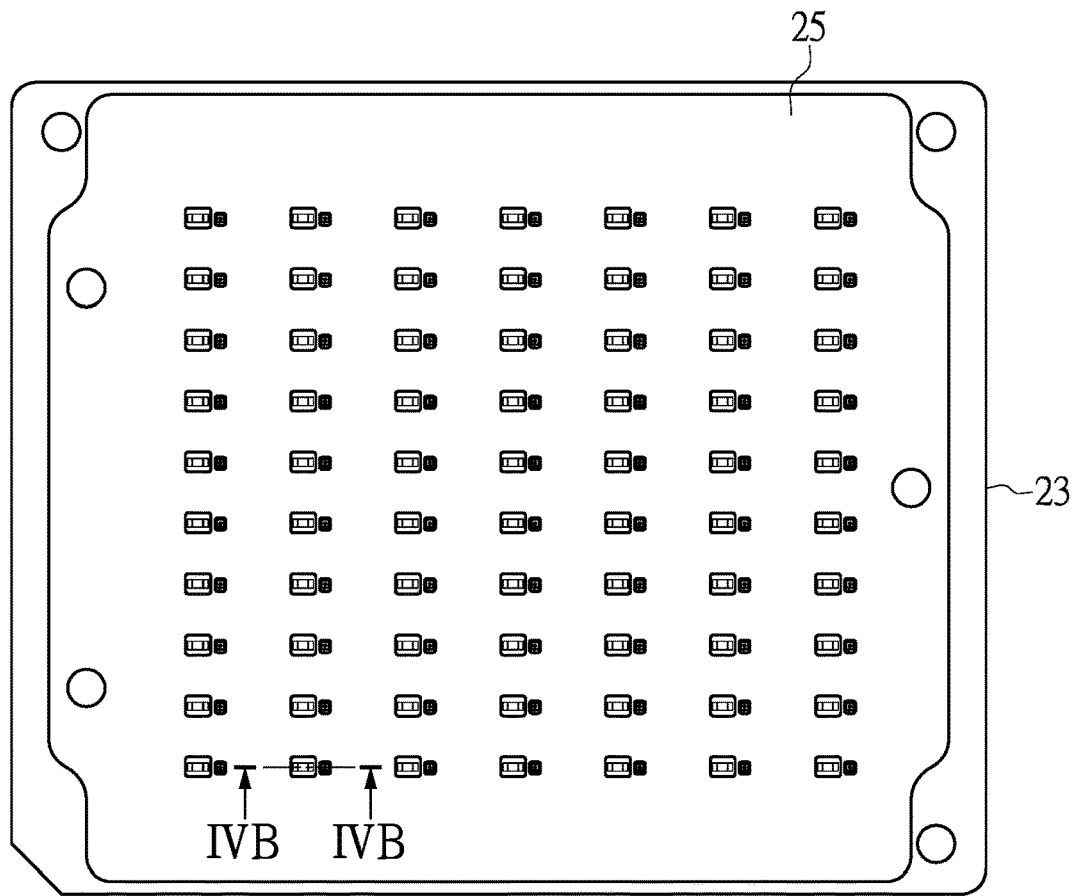
FIG. 4A is a top view showing the plastic shield and the substrate of the present disclosure that are assembled to each other.
Figure 4B:
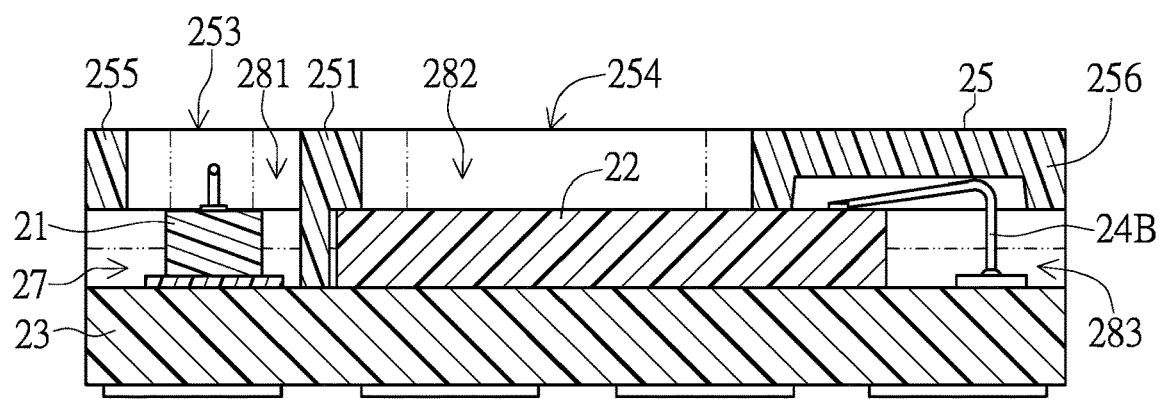
FIG. 4B is a partial sectional view of the plastic shield and the substrate of the present disclosure that are assembled to each other.
Figure 4C:
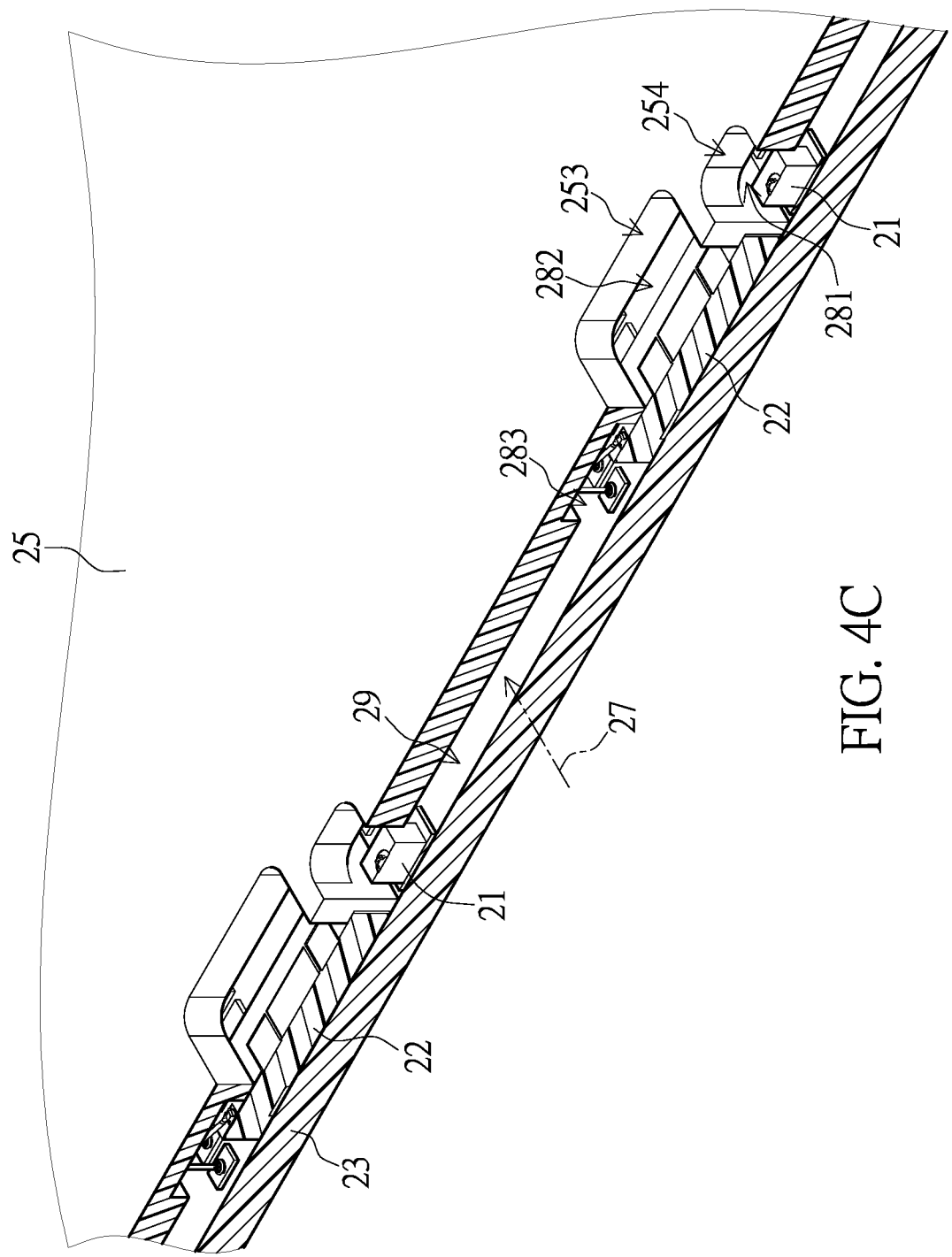
FIG. 4C is a partial sectional perspective view of the plastic shield and the substrate of the present disclosure that are combined to each other.
Figure 5:
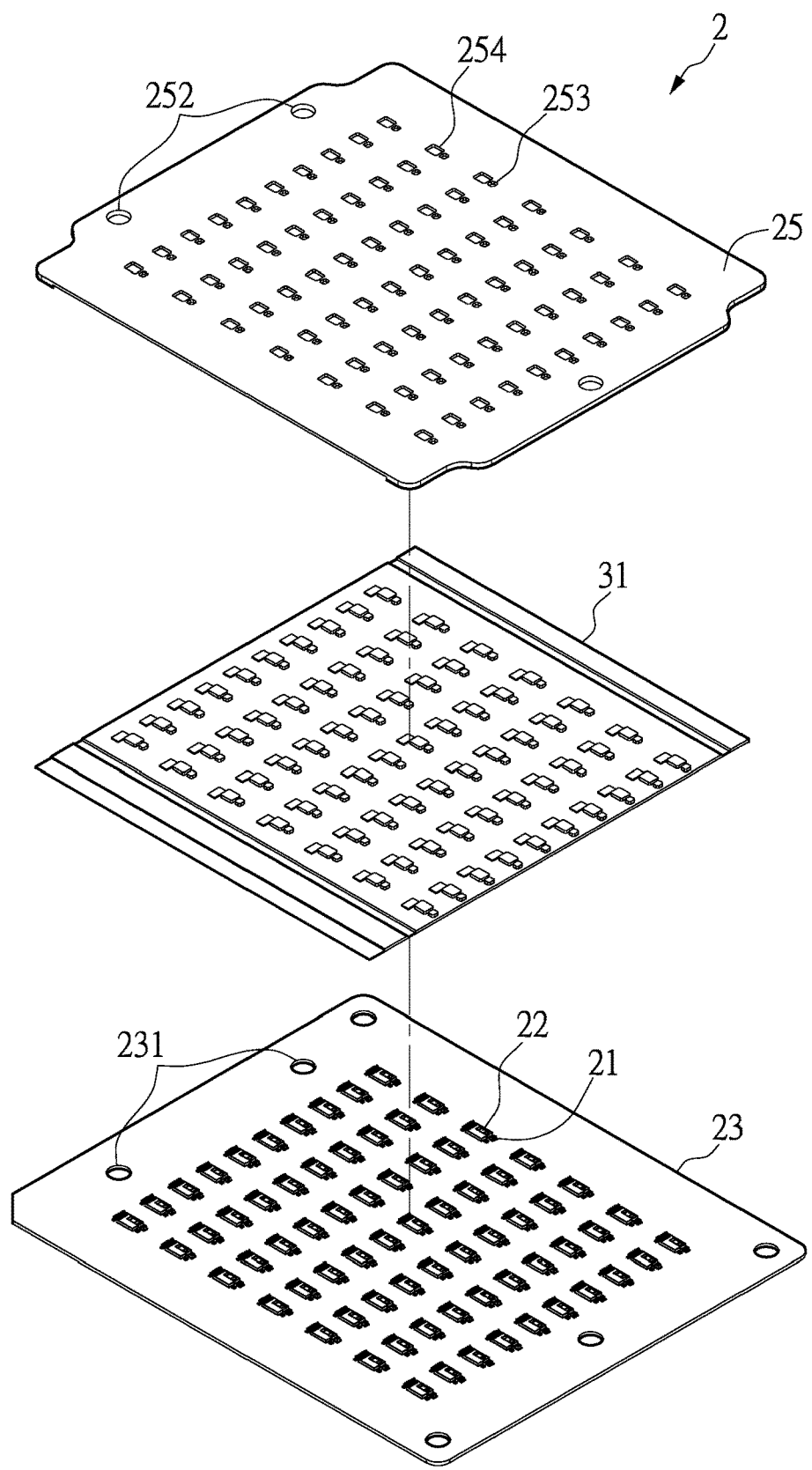
FIG. 5 is an exploded view of the sensor package structure of the present disclosure.

In one embodiment of the present disclosure, when the plastic shield 25 is disposed on the substrate 23, as shown in FIGS. 4A, 4B, and 4C, the adhesive 26 can be selectively applied on the plastic shield 25, such that the plastic shield 25 is adhesively fixed on the substrate 23. The plurality of accommodating grooves 28, includes a plurality of first accommodating grooves 281, a plurality of second accommodating grooves 282, and a plurality of third accommodating grooves 283, along with the plurality of channels 27, are formed between the plastic shield 25 and the substrate 23. The plurality of channels 27, the plurality of first accommodating grooves 281, the plurality of second accommodating grooves 282, and the plurality of third accommodating grooves 283 are formed subsequently in the process, such that a sealing material 30 can be filled between the plastic shield 25 and the substrate 23. Specifically speaking, the plurality of first accommodating grooves 281 and the plurality of second accommodating grooves 282 penetrate through the plastic shield 25, and respectively form the plurality of first openings 253 and the plurality of second openings 254 on a surface of the plastic shield 25, exposing each of the plurality of emitters 21 and the plurality of detectors 22 respectively through the plurality of first openings 253 and the plurality of second openings 254.

Furthermore, an inner surface of the plastic shield 25 is not a smooth surface, and is composed of a plurality of protrusions and recesses with different heights on the inner surface of the plastic shield 25, e.g., the plurality of barrier walls 251, the plurality of first protrusions 255, and the plurality of second protrusions 256. The plurality of barrier walls 251 are disposed between each of the plurality of emitters 21 and the plurality of detectors 22, and are able to block and prevent the signals from being transmitted from the plurality of emitters 21 to the plurality of detectors 22. When the plastic shield 25 is covered on the substrate 23, the plurality of channels 27 and the plurality of accommodating grooves 28, e.g., the plurality of first accommodating grooves 281, the plurality of second accommodating grooves 282, and the plurality of third accommodating grooves 283, are formed between the plastic shield 25 and the substrate 23, by virtue of the presence of the plurality of barrier walls 251, the plurality of first protrusions 255, and the plurality of second protrusions 256 of the plastic shield 25. The plurality of first accommodating grooves 281 can accommodate the plurality of emitters 21, the plurality of second accommodating grooves 282 can accommodate the plurality of detectors 22, and the plurality of third accommodating grooves 283 can accommodate the plurality of second wires 24B, such that the plurality of second wires 24B can be prevented from being damaged when assembling the plastic shield 25 and the substrate 23. Moreover, the plurality of first accommodating grooves 281 and the plurality of second accommodating grooves 282 are respectively formed on each of the plurality of emitters 21 and the plurality of detectors 22, such that the sealing material 30 can be filled in the plurality of first accommodating grooves 281 and the plurality of second accommodating grooves 282 subsequently, so as to be formed on each of the plurality of emitters 21 and the plurality of detectors 22.

Figure 6:
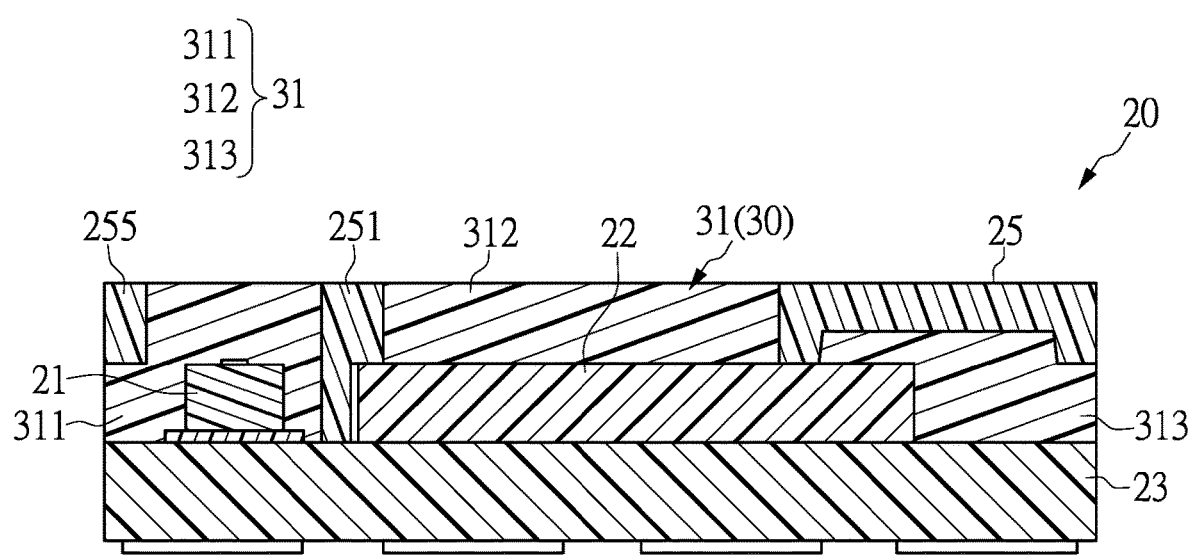
FIG. 6 is a partial sectional view of the sensor package structure of the present disclosure.

In Step S104, the sealing material 30 is filled in the plurality of accommodating grooves 28 that are formed among the plastic shield 25, the substrate 23, and the plurality of sensors 20 through the plurality of channels 27. Referring to FIG. 4C, when the plastic shield 25 and the substrate 23 are assembled to each other, a plurality of slots 29 of the plurality of channels 27, the plurality of first accommodating grooves 281, the plurality of second accommodating grooves 282, and the plurality of third accommodating grooves 283 are formed on a side of the plastic shield 25 and the substrate 23. The sealing material 30 can be introduced in the plurality of channels 27 through the plurality of slots 29 on the side of the plastic shield 25 and the substrate 23, and the sealing material 30 is then filled in the plurality of accommodating grooves 28 along the plurality of channels 27, or the plurality of first accommodating grooves 281, the plurality of second accommodating grooves 282, and the plurality of third accommodating grooves 283. Specifically speaking, as shown in FIG. 6, the sealant 31 can be divided into three portions, a first portion 311, a second portion 312, and a third portion 313. The first portion 311 is formed on and covers each of the plurality of emitters 21, the second portion 312 is formed on part of a surface of each of the plurality of detectors 22, and the third portion 313 is formed on the plurality of second wires 24B, so as to cover the plurality of second wires 24B, and to prevent the plurality of second wires 24B from being damaged. Moreover, the sealing material 30 is flush with a top surface of the plastic shield 25. That is to say, a top surface of the first portion 311 and a top surface of the second portion 312 are preferably level with the top surface of the plastic shield 25. The sealing material 30 is preferably a light-transmittable epoxy, but the present disclosure is not limited thereto, and the sealant 31 of the present disclosure can be any light-transmittable resin that is able to effectively transmit the signals of the plurality of emitters 21.

After finishing the step of filling the sealing material 30 in Step S105, a solidifying step can be included in a preferable embodiment of the present disclosure, such that the plurality of sensor package structures 2 that are disposed between the plastic shield 25 and the substrate 23 with the sealing material 30 therebetween can be processed, e.g., baked, so that the sealing material 30 which was originally in a fluid state can be cured into a sealant 31. After the step of solidifying is finished, the substrate 23 and the plastic shield 25 can be cut, so as to form the plurality of sensor package structures 2, through a cutting step, thus completing the manufacturing method of the sensor package of the present disclosure. Component and circuit testing of the plurality of sensor package structures 2 can be included subsequently, since the relevant testing methods are known to persons having ordinary skill in the art, the testing methods will not be reiterated herein.

Referring to FIG. 2 to FIG. 6, an array of the plurality of sensor package structures 2, which is manufactured through the method provided by the present disclosure, includes the plurality of sensors 20, the substrate 23, and the plastic shield 25. Each of the plurality of sensors 20 includes one of the plurality of emitters 21, one of the plurality of detectors 22, one of the plurality of first wires 24A and the plurality of second wires 24B. The plurality of sensors 20 are disposed on the substrate 23, and each of the plurality of emitters 21 and each of the plurality of detectors 22 are electrically connected to the substrate 23 through one of the plurality of first wires 24A and the plurality of second wires 24B.

The substrate 23 includes the plurality of first positioning portions 231, and the plastic shield 25 includes the plurality of barrier walls 251, the plurality of second positioning portions 252, the plurality of first openings 253, the plurality of second openings 254, and the plurality of first protrusions 255. Each of the plurality of barrier walls 251 is disposed between each of the plurality of emitters 21 and each of the plurality of detectors 22, so as to block and prevent the signals of the plurality of emitters 21 from being directly transmitted to the plurality of detectors 22. Each of the plurality of first positioning portions 231 are respectively disposed to correspond to each of the plurality of second positioning portions 252. Each of the plurality of first openings 253 and each of the plurality of second openings 254 are respectively disposed to correspond to each of the plurality of emitters 21 and each of the plurality of detectors 22. When the plastic shield 25 is covered on the substrate 23, each of the plurality of emitters 21 and each of the plurality of detectors 22 are exposed on the surface of the plastic shield 25, through the plurality of first openings 253 and the plurality of second openings 254 respectively. The adhesive 26 is disposed on the plastic shield 25, such that the plastic shield 25 is adhesively fixed on the substrate 23. When the plastic shield 25 is covered on the substrate 23, the plurality of channels 27 and the plurality of accommodating grooves 28 are formed between the plastic shield 25 and the substrate 23. The sealing material 30 can be introduced in the plurality of channels 27 and the plurality of accommodating grooves 28 through the plurality of channels 27. The sealant 31 is divided into three portions, the first portion 311, the second portion 312, and the third portion 313. The first portion 311 is filled in each of the plurality of first accommodating grooves 281, so as to cover each of the plurality of emitters 21 and protect the plurality of first wires 24A. The second portion 312 is filled in each of the plurality of second accommodating grooves 282, so as to be disposed on part of the surface of each of the plurality of detectors 22. The third portion 313 is filled in each of the plurality of third accommodating grooves 283 so as to cover and protect the plurality of second wires 24B.

The adhesive 26 is preferably a black epoxy resin, the sealing material 30 is preferably a light-transmittable epoxy, the substrate 23 is a PCB, and the plastic shield 25 is composed of an insulating material. The plurality of detectors 22 of the present disclosure is used to detect the signals reflected to the plurality of detectors 22 by an object, and the reflective signals are emitted from the plurality of emitters 21. When the signals emitted by the plurality of emitters 21 is transmitted to the plurality of detectors 22, not only the plurality of detectors 22 is likely to misjudge the signals, but the signals directly emitted by the plurality of emitters 21 is likely to interfere with the reflective signals, both of which decrease the reliability of the plurality of detectors 22. Therefore, the plurality of barrier walls 251 are disposed between each of the plurality of emitters 21 and each of the plurality of detectors 22, so as to block and prevent the signals of the plurality of emitters 21 from being directly transmitted to the plurality of detectors 22.

One of the advantages of the present disclosure is that the manufacturing method of the sensor package structure 2 is able to effectively reduce the space among the plastic shield 25, the plurality of emitters 21, and the plurality of detectors 22, and reduce the volume of the package structure, through disposing the plastic shield 25 and then filling the sealing material 30 in the space between the plastic shield 25 and the substrate 23.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A method of manufacturing a sensor package array, comprising:
    sequentially disposing a plurality of sensors on a substrate in an array;
    electrically connecting the plurality of sensors to the substrate;
    disposing a plastic shield on the substrate, so as to form a plurality of channels and a plurality of accommodating grooves among the plastic shield, the substrate, and the plurality of sensors, wherein the plastic shield includes a plurality of openings that respectively correspond to the plurality of sensors; and
    filling a sealing material in the plurality of accommodating grooves among the plastic shield, the substrate, and the plurality of sensors through the plurality of channels;
    wherein the sealing material is a light-transmittable epoxy resin.

2. The method of manufacturing a sensor package array according to claim 1, wherein before the step of disposing the plastic shield on the substrate, the method further comprises: applying an adhesive on the plastic shield, so that the plastic shield is affixed on a predetermined position on the substrate.

3. The method of manufacturing a sensor package array according to claim 1, wherein each of the plurality of sensors includes one of a plurality of emitters and one of a plurality of detectors, and the plurality of openings include a plurality of first openings disposed above the plurality of emitters and a plurality of second openings disposed above the plurality of detectors.

4. The method of manufacturing a sensor package array according to claim 3, the step of disposing the plastic shield on the substrate, the plurality of accommodating grooves further include a plurality of first accommodating grooves each containing one of the plurality of emitters, a plurality of second accommodating grooves each containing one of the plurality of detectors, the sealing material is introduced in the plurality of channels, and filled in the plurality of first and second accommodating grooves to cover the plurality of emitters and detectors.

5. The method of manufacturing a sensor package array according to claim 4, wherein the plurality of detectors are electrically connected to the substrate via a plurality of wires, when disposing the plastic shield on the substrate, the plurality of accommodating grooves further include a plurality of third accommodating grooves accommodating the plurality of wires connected to the plurality detectors, such that the plurality of wires are prevented from being damaged when assembling the plastic shield and the substrate.

6. The method of manufacturing a sensor package array according to claim 3, wherein the substrate further includes a plurality of first positioning portions, and the plastic shield includes a plurality of second positioning portions, and the plurality of second positioning portions respectively correspond to the plurality of first positioning portions.

7. The method of manufacturing a sensor package array according to claim 6, wherein the plurality of first positioning portions and the plurality of second positioning portions are through hole structures or engaging structures that correspond in position to each other.

8. The method of manufacturing a sensor package array according to claim 1, wherein when the plastic shield is covered on the substrate, a plurality of slots are formed on a side of the plastic shield and the substrate, the sealing material is introduced in the plurality of channels, and filled in the plurality of accommodating grooves between the substrate and the plastic shield.

9. The method of manufacturing a sensor package array according to claim 1, wherein the plastic shield further includes a plurality of barrier walls, and when the plastic shield is disposed on the substrate, the plurality of barrier walls are respectively positioned between each of the plurality of emitters and each of the corresponding plurality of detectors, so as to block and prevent the light emitted by each of the plurality of emitters from being transmitted to each of the corresponding plurality of detectors.

10. The method of manufacturing a sensor package array according to claim 1, further comprising: curing the sealing material to form a sealant.

11. The method of manufacturing a sensor package array according to claim 10, wherein after the step of filling the sealing material between the substrate and the plastic shield, the method further comprises: cutting the substrate, the sealant, and the plastic shield, and forming a plurality of sensor packaging structures.

12. The method of manufacturing a sensor package array according to claim 1, wherein the plastic shield is composed of an insulating material.

13. A sensor package array, comprising:
a substrate;
a plurality of sensors being disposed on the substrate sequentially in an array, wherein each of the plurality of sensors includes one of a plurality of emitters and one of a plurality of detectors, and each of the plurality of emitters and the plurality of detectors are respectively electrically connected to the substrate; and
a plastic shield being disposed on the substrate including a plurality of first openings, a plurality of second openings, and a plurality of barrier walls, wherein each of the plurality of first openings and each of the plurality of second openings are respectively positioned to correspond to each of the plurality of emitters and each of the plurality of detectors, and the barrier wall is disposed between each of the plurality of emitters and each of the plurality of detectors;
wherein a plurality of channels and a plurality of accommodating grooves are formed between the plastic shield and the substrate, and a sealant is filled in the plurality of accommodating grooves through the plurality of channels, such that the plastic shield is fixed on the substrate via the sealant;
wherein the plurality of detectors are electrically connected to the substrate via a plurality of wires;
wherein the sealant includes a first portion, a second portion, and a third portion, and the first portion is formed on and covers each of the plurality of emitters, the second portion is formed on part of a surface of each of the plurality of detectors, and the third portion is formed on and covers the plurality of wires.

14. The sensor package array according to claim 13, wherein the plastic shield further includes a plurality of first protrusions and a plurality of second protrusions, wherein each of the plurality of first openings is respectively defined by one of the plurality of first protrusions and one of the plurality of barrier walls, and each of the plurality of first protrusions and each of the plurality of barrier walls correspond to each other, and wherein each of the plurality of second openings are respectively defined by one of the plurality of second protrusions and one of the plurality of barrier walls, and each of the plurality of second protrusions and each of the plurality of barrier walls correspond to each other.

15. The sensor package array according to claim 13, wherein the plurality of accommodating grooves further include a plurality of first accommodating grooves each accommodating one of the plurality of emitters, a plurality of second accommodating grooves each accommodating one of the plurality of detectors, the sealant is introduced in the plurality of channels, and filled in the plurality of first and second accommodating grooves to cover the plurality of emitters and detectors.

16. The sensor package array according to claim 15, wherein the plurality of accommodating grooves further include a plurality of third accommodating grooves accommodating the plurality of wires connected to the plurality detectors, such that the plurality of wires are prevented from being damaged when assembling the plastic shield and the substrate.

17. A sensor package structure, wherein each of the package structures of the plurality of sensors is formed through cutting the sensor package array as claimed in claim 13.

18. A sensor package array, comprising:
a substrate;
a plurality of sensors being disposed on the substrate sequentially in an array, wherein each of the plurality of sensors includes one of a plurality of emitters and one of a plurality of detectors, and each of the plurality of emitters and the plurality of detectors are respectively electrically connected to the substrate; and
a plastic shield being disposed on the substrate including a plurality of first openings, a plurality of second openings, and a plurality of barrier walls, wherein each of the plurality of first openings and each of the plurality of second openings are respectively positioned to correspond to each of the plurality of emitters and each of the plurality of detectors, and the barrier wall is disposed between each of the plurality of emitters and each of the plurality of detectors;
wherein a plurality of channels and a plurality of accommodating grooves are formed between the plastic shield and the substrate, and a sealant is filled in the plurality of accommodating grooves through the plurality of channels, such that the plastic shield is fixed on the substrate via the sealant;
wherein the sealant is a light-transmittable epoxy resin.

* * * * *